(12) United States Patent
Tsai et al.

(10) Patent No.: US 9,711,560 B2
(45) Date of Patent: Jul. 18, 2017

(54) CMOS IMAGE SENSOR STRUCTURE WITH IR/NIR INTEGRATION

(71) Applicant: TAIWAN SEMICONDUCTOR MANUFACTURING CO., LTD., Hsinchu (TW)

(72) Inventors: Tsung-Han Tsai, Zhunan Township (TW); Kun-Huei Lin, Tainan (TW); Chun-Hao Chou, Tainan (TW); Tzu-Hsuan Hsu, Kaohsiung (TW); Ching-Chun Wang, Tainan (TW); Kuo-Cheng Lee, Tainan (TW); Yung-Lung Hsu, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 200 days.

(21) Appl. No.: 14/562,424

(22) Filed: Dec. 5, 2014

(65) Prior Publication Data
US 2016/0163760 A1   Jun. 9, 2016

(51) Int. Cl.
*H01L 27/146* (2006.01)

(52) U.S. Cl.
CPC .. *H01L 27/14649* (2013.01); *H01L 27/14607* (2013.01); *H01L 27/14621* (2013.01); *H01L 27/14645* (2013.01); *H01L 27/14685* (2013.01)

(58) Field of Classification Search
CPC ......... H01L 27/14649; H01L 27/14607; H01L 27/14621; H01L 27/14645; H01L 27/14685
See application file for complete search history.

(56) References Cited

U.S. PATENT DOCUMENTS

2010/0091163 A1 * 4/2010 Liao .................. H01L 27/14603
                                                      348/308
2015/0221691 A1 * 8/2015 Watanabe .............. H04N 5/332
                                                      348/164

FOREIGN PATENT DOCUMENTS

JP   WO 2014041742 A1 *  3/2014  ............. H04N 5/332

* cited by examiner

*Primary Examiner* — Errol Fernandes
(74) *Attorney, Agent, or Firm* — Maschoff Brennan

(57) ABSTRACT

A semiconductor device includes a substrate, light sensing devices, at least one infrared radiation sensing device, a transparent insulating layer, an infrared radiation cut layer, a color filter layer and an infrared radiation color filter layer. The light sensing devices and the at least one infrared radiation sensing device are disposed in the substrate and are adjacent to each other. The transparent insulating layer is disposed on the substrate overlying the light sensing devices and the at least one infrared radiation sensing device. The infrared radiation cut layer is disposed on the transparent insulating layer overlying the light sensing devices for filtering out infrared radiation and/or near infrared radiation. The color filter layer is disposed on the infrared radiation cut layer. The infrared radiation color filter layer is disposed on the transparent insulating layer overlying the at least one infrared radiation sensing device.

20 Claims, 5 Drawing Sheets

CMOS IMAGE SENSOR STRUCTURE WITH IR/NIR INTEGRATION

BACKGROUND

Semiconductor image sensors are operated to sense light. Typically, the semiconductor image sensors include complementary metal-oxide-semiconductor (CMOS) image sensors (CIS) and charge-coupled device (CCD) sensors, which are widely used in various applications such as digital still camera (DSC), mobile phone camera, digital video (DV) and digital video recorder (DVR) applications. These semiconductor image sensors utilize an array of image sensor elements, each image sensor element including a photodiode and other elements, to absorb light and convert the sensed light into digital data or electrical signals.

As a trend of electronic products including image sensors, such as digital cameras, is developed toward better and better image quality, the image sensors with better image quality are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
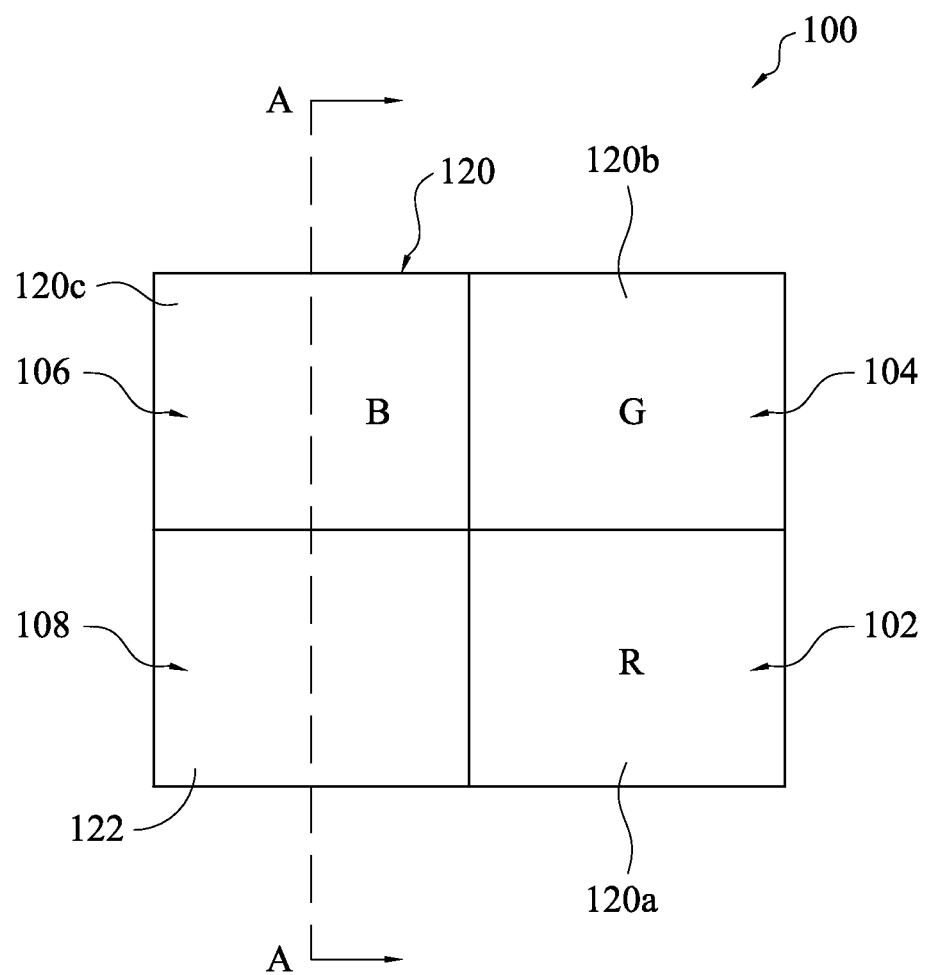
FIG. 1A is schematic top view of a semiconductor device in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

IR or NIR will bias colors of images, so in some photography situations, IR and NIR effects need to be eliminated. Typically, an IR cut technique is used to eliminate the IR and NIR effects by additionally installing optical lenses or IR shutters in electronic products. However, as the electronic products keep shrinking down, it is more difficult to integrate the optical lenses or the IR shutters into the electronic products. On the other hand, in certain applications, such as proximity image sensors and motion image sensors, an IR function is necessary for the electronic products. However, for such electronic products, it needs one or more chips to obtain the IR function, thereby increasing sizes of the electronic products.

Embodiments of the present disclosure are directed to providing a semiconductor device and a method for manufacturing the semiconductor device, in which image pixels with an infrared radiation cut layer and at least one IR pixel are integrated into a unit cell or a single chip for an image sensor, thereby significantly improving the bias of colors of images sensed by the image sensor, and decreasing the size of an image module including the image sensor with an IR cut function. Furthermore, the image sensor may be used in various applications, such as a proximity sensor and a motion sensor.

FIG. 1A is schematic top view of a semiconductor device in accordance with various embodiments. In some embodiments, a semiconductor device 100 is a CMOS image sensor device, which may be operated for sensing incident light 101. The semiconductor device 100 has a front side 103 and a back side 105. In the embodiments, the semiconductor device 100 is a back-side illuminated (BSI) CMOS image sensor device, which is operated to sense the incident light 101 projected from its back side 105. The semiconductor device 100 may include various image pixels and at least one IR pixel. For example, as shown in FIG. 1A, the semiconductor device 100 includes three image pixels 102, 104 and 106 and one IR pixel 108. The semiconductor device 100 may be a RGB image sensor system, and the image pixels 102, 104 and 106 may be respectively a red image pixel, a green image pixel and a blue image pixel. In certain examples, the semiconductor device 100 may be a RGBC image sensor system, and image pixels of the semiconductor device 100 may include a red image pixel, a green image pixel, a blue image pixel and a clear image pixel. In the semiconductor device 100, the image pixels 102, 104 and 106 and the IR pixel 108 are adjacent to each other. In some examples, the image pixels 102, 104 and 106 and the IR pixel 108 are arranged in an array.

Figure 1B:
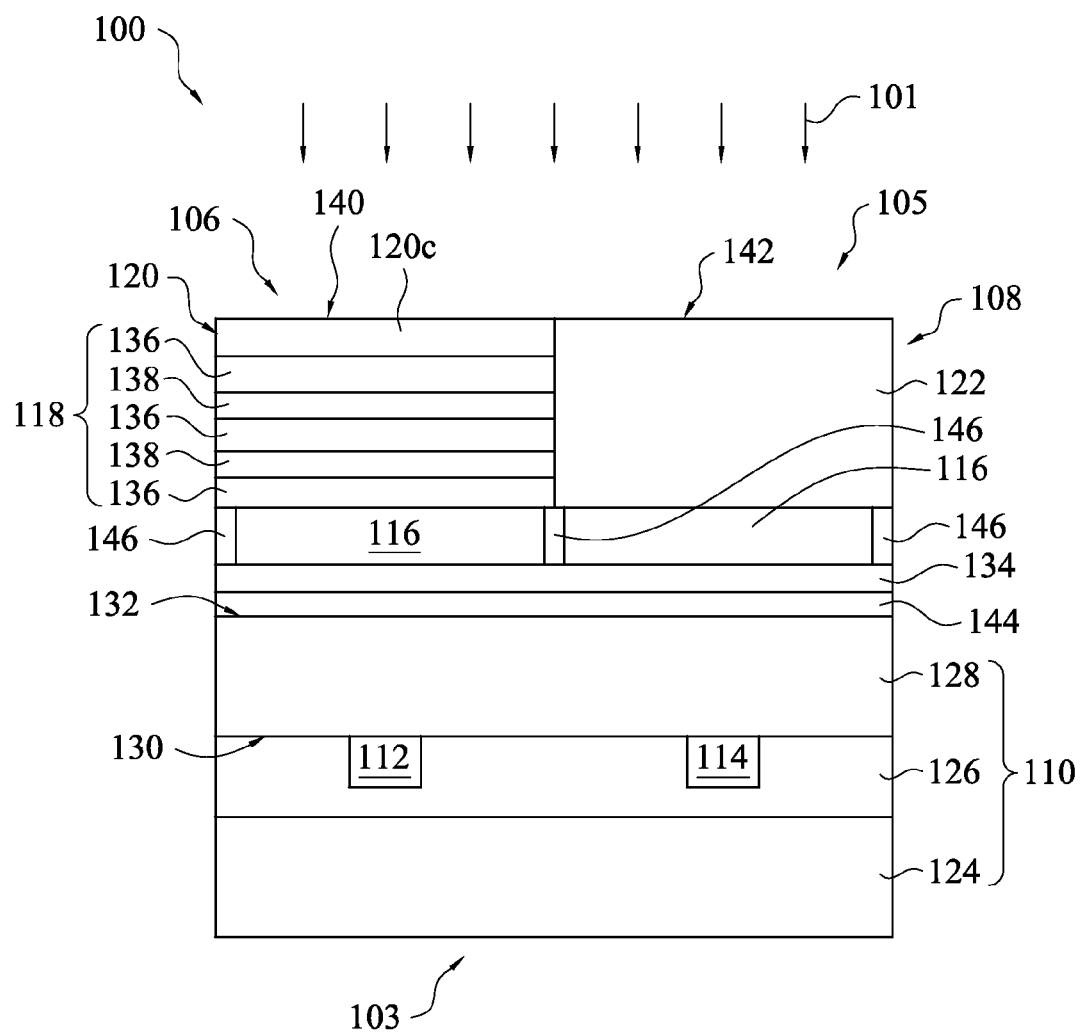
FIG. 1B is schematic cross-sectional view taken along line A-A of FIG. 1A.

Referring to FIG. 1A and FIG. 1B, FIG. 1B is schematic cross-sectional view taken along line A-A of FIG. 1A. As shown in FIG. 1A and FIG. 1B, the semiconductor device 100 includes a substrate 110, various light sensing devices 112, at least one infrared radiation sensing device 114, a transparent insulating layer 116, an infrared radiation cut layer 118, a color filter layer 120 and an infrared radiation color filter layer 122.

In some examples, the substrate 110 includes a carrier 124, a dielectric layer 126 and a semiconductor layer 128. The carrier 124 may be a semiconductor carrier. For example, the carrier 124 is composed of a single-crystalline semiconductor material or a compound semiconductor material. In some exemplary examples, the carrier 124 is formed from silicon, germanium or glass. The semiconductor layer 128 has a first surface 130 and a second surface 132, which are respectively located on opposite sides of the semiconductor layer 128. The semiconductor layer 128 overlies the carrier 124, and the first surface 130 faces the carrier 124. In some examples, the semiconductor layer 128 is formed from epitaxial silicon and/or epitaxial germanium. A thickness of the semiconductor layer 128 may be greater than about 3 micrometers. The dielectric layer 126 is disposed between the carrier 124 and the first surface 130 of the semiconductor layer 128. The dielectric layer 126 may be formed from silicon oxide, silicon nitride or silicon oxynitride.

The light-sensing devices 112 are operated to sense visible light of the incident light 101, and the infrared radiation sensing device 114 is operated to sense IR and/or NIR of the incident light 101. In some examples, each of light-sensing devices 112 and the infrared radiation sensing device 114 includes an image sensor element, in which the image sensor element includes a photodiode and other elements. In the semiconductor device 100, each of the image pixels 102, 104 and 106 includes one light sensing device 112, and each IR pixel 108 includes one infrared radiation sensing device 114. Hence, the semiconductor device 100 illustrated in FIG. 1A includes three light sensing devices 112 and one infrared radiation sensing device 114. The light sensing devices 112 and the infrared radiation sensing device 114 are disposed in the substrate 110, and are adjacent to each other. For example, the light sensing devices 112 and the infrared radiation sensing device 114 are arranged in an array. In some examples, as shown in FIG. 1B, the light sensing devices 112 and the infrared radiation sensing device 114 are disposed on the first surface 130 of the semiconductor layer 128, and the dielectric layer 126 covers the light sensing devices 112 and the infrared radiation sensing device 114. The dielectric layer 126 can be used as a passivation layer and is suitable to protect the light-sensing devices 112, the infrared radiation sensing device 114 and the semiconductor layer 128 from being damaged.

The transparent insulating layer 116 is disposed on the substrate 110 and overlies the light sensing devices 112 and the infrared radiation sensing device 114. In some examples, as shown in FIG. 1A, the transparent insulating layer 116 is disposed on the second surface 132 of the semiconductor layer 128, i.e. the transparent insulating layer 116 and the dielectric layer 126 are on opposite sides of the semiconductor layer 128. For example, the transparent insulating layer 116 is formed from silicon dioxide, silicon nitride or silicon oxynitride. In certain examples, the semiconductor device 100 may further include another transparent insulating layer 134 for meeting process requirements, in which the transparent insulating layer 134 is disposed between the transparent insulating layer 116 and the second surface 132 of the semiconductor layer 128. The transparent insulating layer 134 may be formed from silicon dioxide, silicon nitride or silicon oxynitride.

The infrared radiation cut layer 118 is disposed on the transparent insulating layer 116 and overlies the light sensing devices 112. The infrared radiation cut layer 118 is suitable for filtering out infrared radiation and/or near infrared radiation which is projected toward the light sensing devices 112, in which the infrared radiation cut layer 118 filters out infrared radiation and/or near infrared radiation by refracting and/or diffracting. In some examples, the infrared radiation cut layer 118 includes various first dielectric layers 136 and various second dielectric layers 138, in which the first dielectric layers 136 and the second dielectric layers 138 are alternately stacked with each other, and a dielectric constant of the first dielectric layers 136 is different from a dielectric constant of the second dielectric layers 138. In some exemplary examples, the first dielectric layers 136 are formed from silicon nitride, and the second dielectric layers 138 are formed from silicon dioxide. The first dielectric layers 136 and the second dielectric layers 138 may be formed from different organic materials. In some exemplary examples, a thickness of the infrared radiation cut layer 118 is smaller than about 1 micrometer for keeping sufficient light absorption of the light sensing devices 112.

With the infrared radiation cut layer 118 disposed over the light sensing devices 112, the infrared radiation and/or near infrared radiation projected toward the light sensing devices 112 can be filtered out without needing to use any additional optical lens or IR shutter. Thus, colors of images sensed by the light sensing devices 112 are not affected by the infrared radiation and/or near infrared radiation, thereby enhancing image quality of the semiconductor device 100.

The color filter layer 120 is disposed on the infrared radiation cut layer 118 over the light sensing devices 112, in which the color filter layer 120 includes various color filter portions. For example, referring to FIG. 1A and FIG. 1B simultaneously, the semiconductor device 100 includes the image pixels 102, 104 and 106, and the color filter layer 120 includes color filter portions 120a, 120b and 120c, which are respectively disposed in the image pixels 102, 104 and 106 and correspondingly cover the light sensing devices 112 in the image pixels 102, 104 and 106. In some exemplary examples, the image pixels 102, 104 and 106 are respectively a red image pixel, a green image pixel and a blue image pixel, and the color filter portions 120a, 120b and 120c are respectively a red color filter portion, a green color filter portion and a blue color filter portion. The light sensing devices 112 in the image pixels 102, 104 and 106 can respectively receive the radiations which have been respectively filtered by the color filter portions 120a, 120b and 120c and have been IR filtered by the infrared radiation cut layer 118.

The infrared radiation color filter layer 122 is disposed on the transparent insulating layer 116 in the IR pixel 108, and covers the infrared radiation sensing device 114. The infrared radiation sensing device 114 in the IR pixel 108 can receive the radiations which have been respectively filtered by the infrared radiation color filter layer 122. In some examples, the infrared radiation color filter layer 122 is adjacent to the stacked structure composed of the infrared radiation cut layer 118 and the color filter layer 120. A top surface 142 of the infrared radiation color filter layer 122 may be substantially level with a top surface 140 of the color filter layer 120.

With the IR pixel 108 including the infrared radiation color filter layer 122 and the infrared radiation sensing device 114, the semiconductor device 100 can provide an IR function without needing to use any additional chip for achieving the IR function. Thus, the size of an image sensor module can be decreased.

As shown in FIG. 1B, the semiconductor device 100 may optionally include a negatively charged optical layer 144 which is disposed between the substrate 110 and the transparent insulating layer 116. In some examples, the negatively charged optical layer 144 is disposed between the second surface 132 of the semiconductor layer 128 of the substrate 110 and the transparent insulating layer 134. The negatively charged optical layer 144 is a layer including negative charges, in which the negative charges can be coupled with leakage current occurring near the second surface 132 of the semiconductor layer 128, such that the leakage current can be reduced or eliminated by the negatively charged optical layer 144. Furthermore, with the negatively charged optical layer 144, the amount of light entering the semiconductor layer 128 is increased. The negatively charged optical layer 144 may include two or more kinds of dielectric layers which are alternately stacked with each other, in which dielectric constants of the kinds of the dielectric layers are different. In some examples, the negatively charged optical layer 144 is formed from a dielectric material having a high dielectric constant, such as hafnium dioxide ($HaO_2$), tantalum pentoxide ($Ta_2O_5$), titanium dioxide ($TiO_2$) and aluminum oxide ($Al_2O_3$).

Referring to FIG. 1B again, the semiconductor device 100 may optionally include a grid layer 146 which is disposed in the transparent insulating layer 116. The grid layer 146 is located between the image pixels 102, 104 and 106 and between the IR pixel 108 and the image pixels 102, 104 and 106. Thus, the grid layer 146 is located between the light sensing devices 112 in the image pixels 102, 104 and 106 the and between the infrared radiation sensing device 114 in the IR pixel 108 and the light sensing devices 112 in the image pixels 102, 104 and 106. In some examples, the grid layer 146 passes through the transparent insulating layer 116. In certain examples, the grid layer 146 may not penetrate through the transparent insulating layer 116. The grid layer 146 is suitable for blocking light from being reflected or refracted to the adjacent pixels. In some exemplary examples, the grid layer is formed form tungsten (W) or aluminum-copper alloy (AlCu).

Figure 2A:
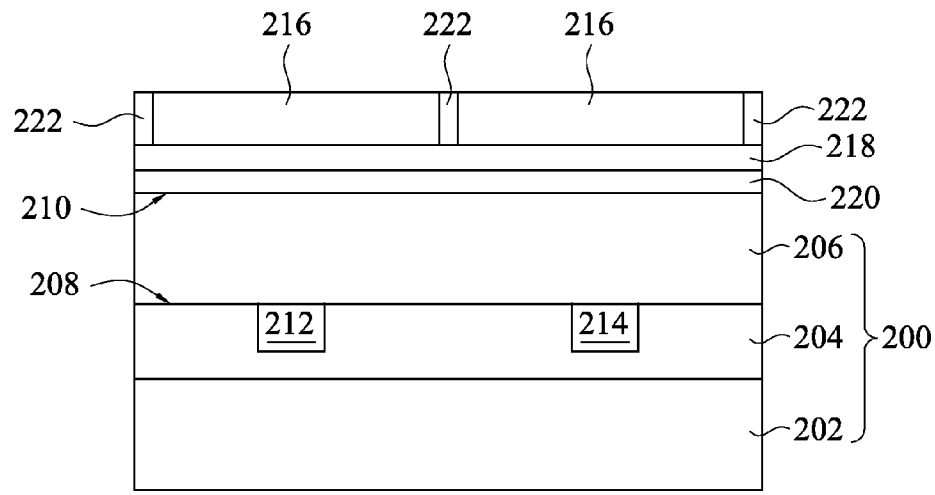
FIG. 2A through FIG. 2D are schematic cross-sectional views of intermediate stages showing a method for manufacturing a semiconductor device in accordance with various embodiments.

Referring to FIG. 2A through FIG. 2D, FIG. 2A through FIG. 2D are schematic cross-sectional views of intermediate stages showing a method for manufacturing a semiconductor device in accordance with various embodiments. As shown in FIG. 2A, a substrate 200 is provided. In some examples, the substrate 200 includes a carrier 202, a dielectric layer 204 and a semiconductor layer 206. The carrier 202 may be composed of a semiconductor material, such as a single-crystalline semiconductor material or a compound semiconductor material. In some exemplary examples, the carrier 202 is formed from silicon, germanium or glass.

The semiconductor layer 206 has a first surface 208 and a second surface 210 opposite to the first surface 208. The semiconductor layer 206 is formed over the carrier 202 by using, for example, a bonding technique. The operation of forming the semiconductor layer 206 is performed to form the semiconductor layer 206 having the first surface 208 facing the carrier 202. In some examples, the operation of forming the semiconductor layer 206 includes forming the semiconductor layer 206 from epitaxial silicon and/or epitaxial germanium. In some exemplary examples, the operation of forming the semiconductor layer 206 is performed to form the semiconductor layer 206 having a thickness which is greater than about 3 micrometers. The dielectric layer 204 is formed between the carrier 202 and the first surface 208 of the semiconductor layer 206 using a deposition technique, such as a chemical vapor deposition (CVD) technique. In some exemplary examples, the operation of forming the dielectric layer 204 includes forming the dielectric layer 204 from silicon oxide, silicon nitride or silicon oxynitride.

Various light-sensing devices 212 and at least one infrared radiation sensing device 214 are formed in the substrate 200, in which the light-sensing devices 212 are formed for image pixels, and the infrared radiation sensing device 214 is formed for an IR pixel. The light sensing devices 212 and the infrared radiation sensing device 214 are adjacent to each other. For example, the light sensing devices 212 and the infrared radiation sensing device 214 are arranged in an array. The light-sensing devices 212 are operated to sense visible light of incident light, and the infrared radiation sensing device 214 is operated to sense IR and/or NIR of the incident light. In some examples, each of light-sensing devices 212 and the infrared radiation sensing device 214 includes an image sensor element, in which the image sensor element includes a photodiode and other elements.

In some examples, in the operation of providing the substrate 200 and the operation of forming the light-sensing devices 212 and the infrared radiation sensing device 214, the light-sensing devices 212 and the infrared radiation sensing device 214 are firstly formed on the first surface 208 of the semiconductor layer 206, and the dielectric layer 204 is formed to cover the light-sensing devices 212, the infrared radiation sensing device 214 and the first surface 208 of the semiconductor layer 206, and the carrier 202 is bonded to the dielectric layer 204. After the dielectric layer 204 is deposited, a planarization operation may be optionally performed to planarize the dielectric layer 204. The dielectric layer 204 is planarized, so that the carrier 202 can be successfully bonded to the dielectric layer 204. The planarization operation may be performed using a chemical mechanical polishing (CMP) technique. The dielectric layer 204 can be used as a passivation layer and is suitable to protect the light-sensing devices 212, the infrared radiation sensing device 214 and the semiconductor layer 206 from being damaged.

After the light-sensing devices 212 and the infrared radiation sensing device 214 are formed in the substrate 200, a transparent insulating layer 216 is formed on the substrate 200 and overlies the light sensing devices 212 and the infrared radiation sensing device 214. In some examples, the transparent insulating layer 216 is formed on the second surface 210 of the semiconductor layer 206. The operation of forming the transparent insulating layer 216 may be performed using a chemical vapor deposition technique. In some exemplary examples, the operation of forming the transparent insulating layer 216 includes forming the transparent insulating layer 216 from silicon dioxide, silicon nitride or silicon oxynitride.

Optionally, before the operation of forming the transparent insulating layer 216, another transparent insulating layer 218 may be formed on the substrate 200 overlying the light sensing devices 212 and the infrared radiation sensing device 214, and then the transparent insulating layer 216 may be formed on the transparent insulating layer 218, i.e. the transparent insulating layer 218 may be disposed between the transparent insulating layer 216 and the second surface 210 of the semiconductor layer 206. The operation of forming the transparent insulating layer 218 may be performed using a chemical vapor deposition technique. In some exemplary examples, the operation of forming the transparent insulating layer 218 includes forming the transparent insulating layer 218 from silicon dioxide, silicon nitride or silicon oxynitride.

In some examples, before the operation of forming the transparent insulating layer 216, a negatively charged optical layer 220 may be optionally formed on the substrate 200 overlying the light sensing devices 212 and the infrared radiation sensing device 214, so that the negatively charged optical layer 220 may be disposed between the substrate 200 and the transparent insulating layer 216. In certain examples, the operation of forming the negatively charged optical layer 220 is performed to form the negatively charged optical layer 220 between the second surface 210 of the semiconductor layer 206 of the substrate 200 and the transparent insulating layer 218. The operation of forming the negatively charged optical layer 220 may be performed using a chemical vapor deposition technique. In some exemplary examples, the operation of forming the negatively charged optical layer 220 is performed to form the negatively charged optical layer 220 including two or more kinds of dielectric layers alternately stacked with each other, in which dielectric constants of the kinds of the dielectric layers are different. For example, the operation of forming the negatively charged optical layer 220 may be performed to form the negatively charged optical layer 220 from a dielectric material having a high dielectric constant, such as hafnium dioxide, tantalum pentoxide, titanium dioxide and aluminum oxide.

The negatively charged optical layer 220 is formed to include various negative charges. The negative charges can be coupled with leakage current occurred near the second surface 210 of the semiconductor layer 206, so that the leakage current can be reduced or eliminated by the negatively charged optical layer 220. Furthermore, with the negatively charged optical layer 220, an amount of light entering the semiconductor layer 206 is increased.

Optionally, as shown in FIG. 2A, after the transparent insulating layer 216 is formed, a grid layer 222 may be formed in the transparent insulating layer 216 for blocking light from being reflected or refracted to adjacent pixels. The operation of forming the grid layer 222 is performed to form the grid layer 222 between the light sensing devices 212 and between the infrared radiation sensing device 214 and the light sensing devices 212. In some examples, the grid layer 222 is formed to pass through the transparent insulating layer 216. In certain examples, the grid layer 222 may not penetrate through the transparent insulating layer 216. The operation of forming the grid layer 222 may include forming the grid layer 222 from tungsten or aluminum-copper alloy.

Figure 2B:
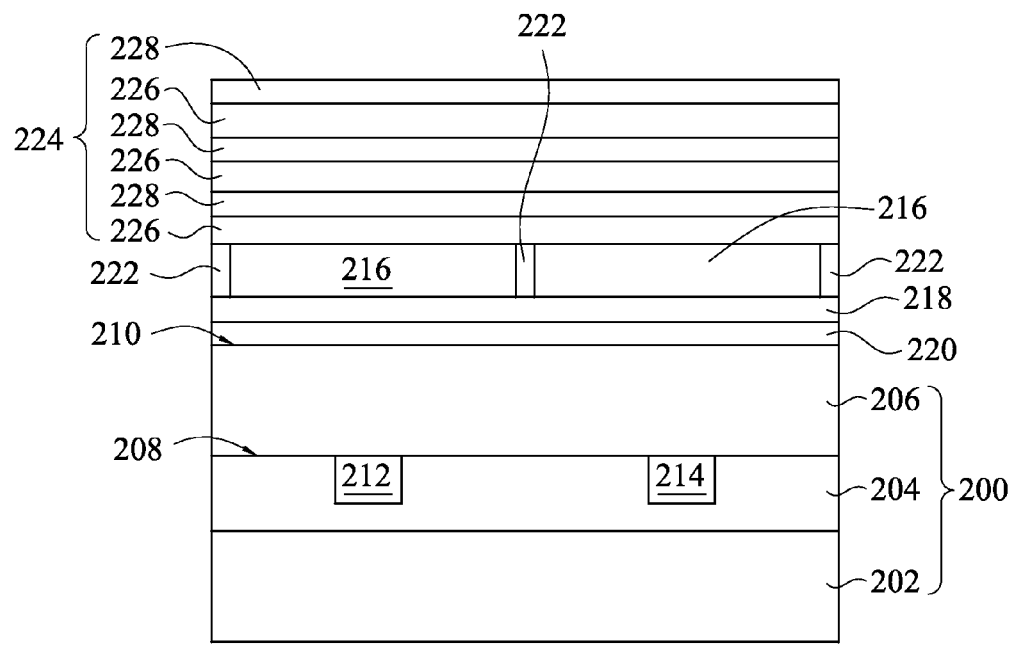

As shown in FIG. 2B, an infrared radiation cut layer 224 is formed on the transparent insulating layer 216 overlying the light sensing devices 212 and the infrared radiation sensing device 214 for filtering out infrared radiation and/or near infrared radiation. In some examples, the operation of forming the infrared radiation cut layer 224 is performed to form the infrared radiation cut layer 224 including various first dielectric layers 226 and various second dielectric layers 228. The first dielectric layers 226 and the second dielectric layers 228 are formed to be alternately stacked with each other, in which a dielectric constant of the first dielectric layers 226 is different from a dielectric constant of the second dielectric layers 228. For example, the operation of forming the first dielectric layers 226 includes forming the first dielectric layers 226 from silicon nitride, and the operation of forming the second dielectric layers 228 includes forming the second dielectric layers 228 from silicon dioxide. The operation of forming the first dielectric layers 226 and the second dielectric layers 228 may include forming the first dielectric layers 226 and the second dielectric layers 228 from different organic materials. In some exemplary examples, the operation of forming the infrared radiation cut layer 224 is performed to form the infrared radiation cut layer 224 having a thickness which is smaller than about 1 micrometer.

Figure 2C:
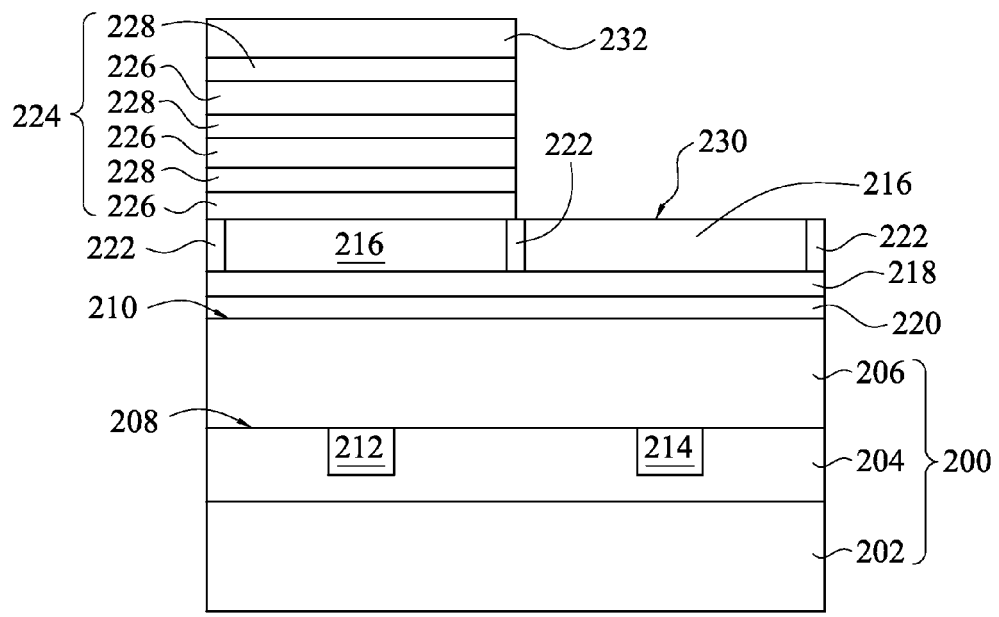

As shown in FIG. 2C, a portion of the infrared radiation cut layer 224 overlying the infrared radiation sensing device 214 is removed to expose a portion 230 of the transparent insulating layer 216. Thus, after the operation of removing the portion of the infrared radiation cut layer 224 is performed, the other portion of the infrared radiation cut layer 224 only remains over the light sensing devices 212 in the image pixels. In some examples, the operation of removing the portion of the infrared radiation cut layer 224 is performed using a photolithography technique and an etching technique. By forming the infrared radiation cut layer 224 over the light sensing devices 212 in the image pixels, the infrared radiation and/or near infrared radiation projected toward the light sensing devices 212 can be filtered out without needing to use any additional optical lens or IR shutter. Thus, colors of images sensed by the light sensing devices 212 are not biased by the infrared radiation and/or near infrared radiation, thereby enhancing image quality.

Referring to FIG. 2C again, after the portion of the infrared radiation cut layer 224 overlying the infrared radiation sensing device 214 is removed, a color filter layer 232 is formed on the other portion of the infrared radiation cut layer 232 by, for example, a deposition technique. The color filter layer 224 includes various color filter portions respectively disposed in the image pixels, i.e. each image pixel includes one color filter portion. For example, for a RGB image sensor system, the operation of forming the color filter layer 232 is performed to form the color filter layer 232 including at least one red color filter portion, at least one green color filter portion and at least one blue color filter portion. For a RGBC image sensor system, the operation of forming the color filter layer 232 is performed to form the color filter layer 232 including at least one red color filter portion, at least one green color filter portion, at least one blue color filter portion and at least one clear portion. The light sensing devices 212 can respectively receive the radiations which have been respectively filtered by the color filter portions of the color filter layer 232 and have been IR filtered by the infrared radiation cut layer 224.

Figure 2D:
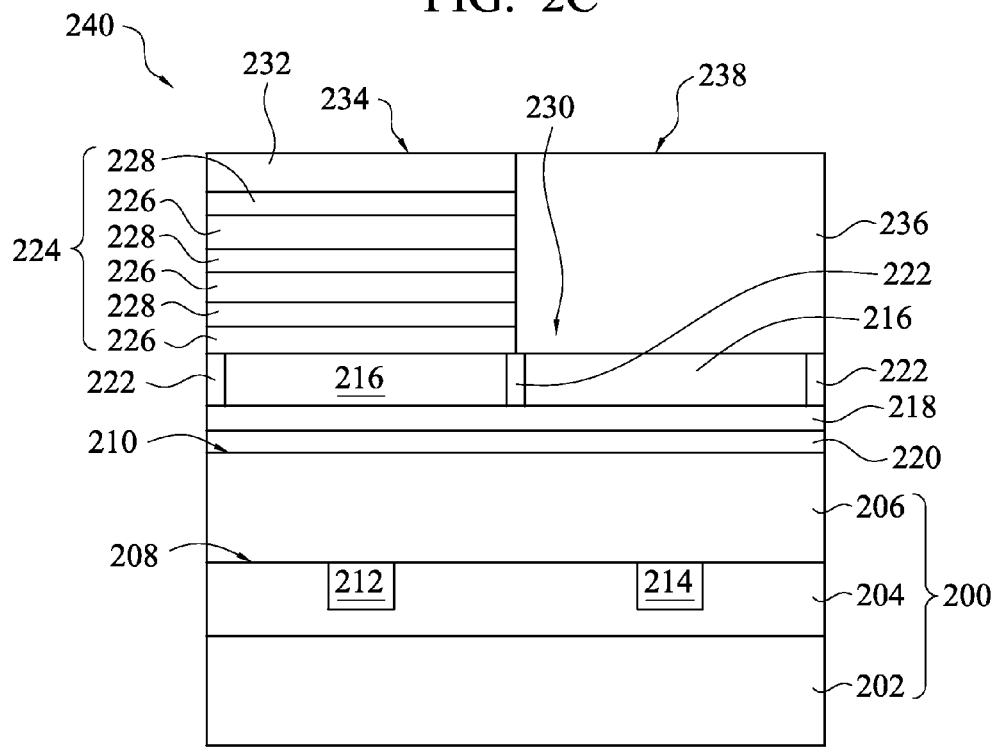

As shown in FIG. 2D, an infrared radiation color filter layer 236 is formed on the portion of the transparent insulating layer 216 overlying the infrared radiation sensing device 214, i.e. the infrared radiation color filter layer 236 is formed in the IR pixel and covers the infrared radiation sensing device 214, so as to complete a semiconductor device 240. In some examples, the operation of forming the infrared radiation color filter layer 236 is performed to form the infrared radiation color filter layer 236 which is adjacent to the stacked structure composed of the infrared radiation cut layer 224 and the color filter layer 232. The operation of forming the infrared radiation color filter layer 236 is performed to form the infrared radiation color filter layer 236 having a top surface 238 which may be substantially level with a top surface 234 of the color filter layer 232. In some examples, the operation of forming the color filter layer 232 may be performed after the operation of forming the infrared radiation color filter layer 236.

By integrating the IR pixel including the infrared radiation color filter layer 236 and the infrared radiation sensing device 214 with the image pixels including the infrared radiation cut layer 224 and the light sensing devices 212, the semiconductor device 240 can provide an IR function without needing to use any additional chip for achieving the IR function. Thus, the size of an image sensor module including the semiconductor device 240 can be decreased.

Figure 3:
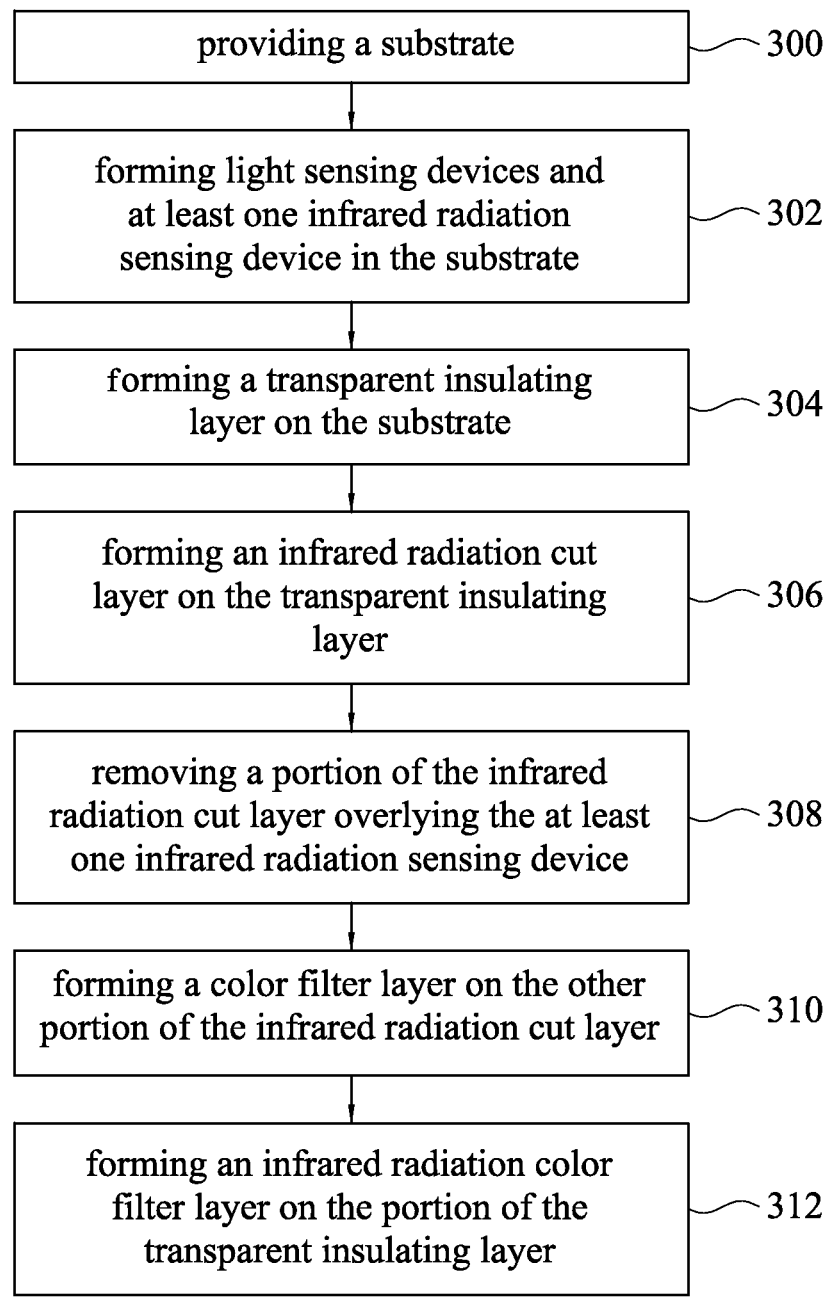
FIG. 3 is a flow chart of a method for manufacturing a semiconductor device in accordance with various embodiments.

Referring to FIG. 3 with FIG. 2A through FIG. 2D, FIG. 3 is a flow chart of a method for manufacturing a semiconductor device in accordance with various embodiments. The method begins at operation 300, where a substrate 200 is provided. In some examples, the operation of providing the substrate 200 is performed to provide the substrate 200 including a carrier 202, a dielectric layer 204 and a semiconductor layer 206. The semiconductor layer 206 has a first surface 208 and a second surface 210, in which the first surface 208 is opposite to the second surface 210 and faces the carrier 202. The semiconductor layer 206 is formed over the carrier 202 by using, for example, a bonding technique. A thickness of the semiconductor layer 206 may be, for example, greater than about 3 micrometers. The dielectric layer 204 is formed between the carrier 202 and the first surface 208 of the semiconductor layer 206 using a deposition technique, such as a chemical vapor deposition technique.

At operation 302, referring to FIG. 2A again, various light-sensing devices 212 and at least one infrared radiation sensing device 214 are formed in the substrate 200, in which the light-sensing devices 212 are formed for image pixels, and the infrared radiation sensing device 214 is formed for an IR pixel. The light sensing devices 212 and the infrared radiation sensing device 214 are adjacent to each other. For example, the light sensing devices 212 and the infrared radiation sensing device 214 are arranged in an array. In some examples, each of light-sensing devices 212 and the infrared radiation sensing device 214 includes an image sensor element, in which the image sensor element includes a photodiode and other elements.

In some examples, at the operations 302 and 304, the light-sensing devices 212 and the infrared radiation sensing device 214 are firstly formed on the first surface 208 of the semiconductor layer 206, and the dielectric layer 204 is formed to cover the light-sensing devices 212, the infrared radiation sensing device 214 and the first surface 208 of the semiconductor layer 206, and the carrier 202 is then bonded to the dielectric layer 204. After the dielectric layer 204 is deposited, a planarization operation may be optionally performed to planarize the dielectric layer 204 using, for example, a chemical mechanical polishing technique.

At operation 304, a transparent insulating layer 216 is formed on the second surface 210 of the semiconductor layer 206 of the substrate 200 overlying the light sensing devices 212 and the infrared radiation sensing device 214 using, for example, a chemical vapor deposition technique. In certain examples, another transparent insulating layer 218 may be optionally formed on the substrate 200 overlying the light sensing devices 212 and the infrared radiation sensing device 214, and then the transparent insulating layer 216 may be formed on the transparent insulating layer 218. The operation of forming the transparent insulating layer 218 may be performed using a chemical vapor deposition technique.

In some examples, before the operation of forming the transparent insulating layer 216, a negatively charged optical layer 220 may be optionally formed on the substrate 200 overlying the light sensing devices 212 and the infrared radiation sensing device 214, so that the negatively charged optical layer 220 may be disposed between the second surface 210 of the semiconductor layer 206 of the substrate 200 and the transparent insulating layer 216. The operation of forming the negatively charged optical layer 220 may be performed using a chemical vapor deposition technique. The operation of forming the negatively charged optical layer 220 may be performed to form the negatively charged optical layer 220 including two or more kinds of dielectric layers alternately stacked with each other, in which dielectric constants of the kinds of the dielectric layers are different. The operation of forming the negatively charged optical layer 220 may be performed to form the negatively charged optical layer 220 from a dielectric material having a high dielectric constant, such as hafnium dioxide, tantalum pentoxide, titanium dioxide and aluminum oxide.

Optionally, as shown in FIG. 2A, a grid layer 222 may be formed in the transparent insulating layer 216 between the light sensing devices 212 and between the infrared radiation sensing device 214 and the light sensing devices 212 for blocking light from being reflected or refracted to adjacent pixels. In some examples, the grid layer 222 is formed to pass through the transparent insulating layer 216. In certain examples, the grid layer 222 may not penetrate through the transparent insulating layer 216. The operation of forming the grid layer 222 may include forming the grid layer 222 from tungsten or aluminum-copper alloy.

At operation 306, as shown in FIG. 2B, an infrared radiation cut layer 224 is formed on the transparent insulating layer 216 overlying the light sensing devices 212 and the infrared radiation sensing device 214 for filtering out infrared radiation and/or near infrared radiation. In some examples, the operation of the infrared radiation cut layer 224 is performed to form the infrared radiation cut layer 224 including various first dielectric layers 226 and various second dielectric layers 228 alternately stacked with each other, in which a dielectric constant of the first dielectric layers 226 is different from a dielectric constant of the second dielectric layers 228. For example, the operation of forming the first dielectric layers 226 includes forming the first dielectric layers 226 from silicon nitride, and the operation of forming the second dielectric layers 228 includes forming the second dielectric layers 228 from silicon dioxide. The operation of forming the first dielectric layers 226 and the second dielectric layers 228 may include forming the first dielectric layers 226 and the second dielectric layers 228 from different organic materials. The operation of forming the infrared radiation cut layer 224 may be performed to form the infrared radiation cut layer 224 having a thickness which is smaller than about 1 micrometer.

At operation 308, as shown in FIG. 2C, a portion of the infrared radiation cut layer 224 overlying the infrared radiation sensing device 214 is removed to expose a portion 230 of the transparent insulating layer 216 and to remain the other portion of the infrared radiation cut layer 224 over the light sensing devices 212 in the image pixels. In some examples, the operation of removing the portion of the infrared radiation cut layer 224 is performed using a photolithography technique and an etching technique. By forming the infrared radiation cut layer 224 over the light sensing devices 212 in the image pixels, the infrared radiation and/or near infrared radiation projected toward the light sensing devices 212 can be filtered out without needing to use any additional optical lens or IR shutter, thereby preventing colors of images sensed by the light sensing devices 212 from being biased by the infrared radiation and/or near infrared radiation.

At operation 310, referring to FIG. 2C again, a color filter layer 232 is formed on the other portion of the infrared radiation cut layer 232 by, for example, a deposition technique. The color filter layer 224 includes various color filter portions respectively disposed in the image pixels. For example, the operation of forming the color filter layer 232 is performed to form the color filter layer 232 including at least one red color filter portion, at least one green color filter portion and at least one blue color filter portion. In certain examples, the operation of forming the color filter layer 232 is performed to form the color filter layer 232 including at least one red color filter portion, at least one green color filter portion, at least one blue color filter portion and at least one clear portion.

At operation 312, as shown in FIG. 2D, an infrared radiation color filter layer 236 is formed on the portion of the transparent insulating layer 216 overlying the infrared radiation sensing device 214 to complete a semiconductor device 240. In some examples, the operation of forming the infrared radiation color filter layer 236 is performed to form the infrared radiation color filter layer 236 which is adjacent to the stacked structure composed of the infrared radiation cut layer 224 and the color filter layer 232. The operation of forming the infrared radiation color filter layer 236 may be performed to form the infrared radiation color filter layer 236 having a top surface 238 which may be substantially level with a top surface 234 of the color filter layer 232. In some examples, the operation of forming the color filter layer 232 may be performed after the operation of forming the infrared radiation color filter layer 236.

In accordance with an embodiment, the present disclosure discloses a semiconductor device. The semiconductor device includes a substrate, light sensing devices, at least one infrared radiation sensing device, a transparent insulating layer, an infrared radiation cut layer, a color filter layer and an infrared radiation color filter layer. The light sensing devices are disposed in the substrate. The at least one infrared radiation sensing device is disposed in the substrate, in which the light sensing devices and the at least one infrared radiation sensing device are adjacent to each other. The transparent insulating layer is disposed on the substrate and overlies the light sensing devices and the at least one infrared radiation sensing device. The infrared radiation cut layer is disposed on the transparent insulating layer and overlies the light sensing devices for filtering out infrared radiation and/or near infrared radiation. The color filter layer is disposed on the infrared radiation cut layer. The infrared radiation color filter layer is disposed on the transparent insulating layer and overlies the at least one infrared radiation sensing device.

In accordance with another embodiment, the present disclosure discloses a semiconductor device. The semiconductor device includes a carrier, a semiconductor layer, light sensing devices, at least one infrared radiation sensing device, a dielectric layer, a transparent insulating layer, an infrared radiation cut layer, a color filter layer and an infrared radiation color filter layer. The semiconductor layer is overlying the carrier, in which the semiconductor layer has a first surface and a second surface opposite to the first surface. The light sensing devices and the at least one infrared radiation sensing device are disposed on the first surface of the semiconductor layer. The dielectric layer is disposed between the carrier and the first surface of the semiconductor layer and covers the light sensing devices and the at least one infrared radiation sensing device. The transparent insulating layer is disposed on the second surface of the semiconductor layer. The infrared radiation cut layer is disposed on the transparent insulating layer overlying the light sensing devices for filtering out infrared radiation and/or near infrared radiation. The color filter layer is disposed on the infrared radiation cut layer. The infrared radiation color filter layer is disposed on the transparent insulating layer overlying the at least one infrared radiation sensing device.

In accordance with yet another embodiment, the present disclosure discloses a method for manufacturing a semiconductor device. In this method, a substrate is provided. Light sensing devices and at least one infrared radiation sensing device are formed in the substrate, in which the light sensing devices and the at least one infrared radiation sensing device are adjacent to each other. A transparent insulating layer is formed on the substrate overlying the light sensing devices and the at least one infrared radiation sensing device. An infrared radiation cut layer is formed on the transparent insulating layer for filtering out infrared radiation and/or near infrared radiation. A portion of the infrared radiation cut layer overlying the at least one infrared radiation sensing device is removed to expose a portion of the transparent insulating layer. A color filter layer is formed on the other portion of the infrared radiation cut layer. An infrared radiation color filter layer is formed on the portion of the transparent insulating layer overlying the at least one infrared radiation sensing device.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
   a substrate;
   a plurality of light sensing devices disposed in the substrate;
   at least one infrared radiation sensing device disposed in the substrate, wherein the light sensing devices and the at least one infrared radiation sensing device are adjacent to each other;
   a transparent insulating layer on the substrate overlying the light sensing devices and the at least one infrared radiation sensing device;
   an infrared radiation cut layer disposed on and contacting a surface of the transparent insulating layer overlying the light sensing devices for filtering out infrared radiation and/or near infrared radiation;
   a color filter layer on the infrared radiation cut layer; and
   an infrared radiation color filter layer disposed on and contacting the surface of the transparent insulating layer overlying the at least one infrared radiation sensing device.

2. The semiconductor device of claim 1, further comprising a negatively charged optical layer disposed between the substrate and the transparent insulating layer.

3. The semiconductor device of claim 2, wherein the negatively charged optical layer is formed from hafnium dioxide (HaO2), tantalum pentoxide ($Ta_2O_5$), titanium dioxide ($TiO_2$), or aluminum oxide ($Al_2O_3$).

4. The semiconductor device of claim 1, further comprising a grid layer disposed in the transparent insulating layer, wherein the grid layer is located between the light sensing devices and between the at least one infrared radiation sensing device and the light sensing devices.

5. The semiconductor device of claim 4, wherein the grid layer is formed form tungsten (W) or aluminum-copper alloy (AlCu).

6. The semiconductor device of claim 1, wherein the infrared radiation cut layer comprises a plurality of first dielectric layers and a plurality of second dielectric layers alternately stacked with each other, and a dielectric constant of the first dielectric layers is different from a dielectric constant of the second dielectric layers.

7. The semiconductor device of claim 1, wherein a top surface of the color filter layer is substantially level with a top surface of the infrared radiation color filter layer.

8. The semiconductor device of claim 1, wherein a thickness of the infrared radiation cut layer is smaller than 1 micrometer.

9. The semiconductor device of claim 1, further comprising another transparent insulating layer disposed between the transparent insulating layer and the substrate.

10. The semiconductor device of claim 2, wherein the negatively charged optical layer comprises a plurality of kinds of dielectric layers which are alternately stacked with each other, and dielectric constants of the kinds of the dielectric layers are different.

11. A semiconductor device, comprising:
a carrier;
a semiconductor layer overlying the carrier, wherein the semiconductor layer has a first surface and a second surface opposite to the first surface;
a plurality of light sensing devices and at least one infrared radiation sensing device disposed on the first surface of the semiconductor layer;
a dielectric layer disposed between the carrier and the first surface of the semiconductor layer and covering the light sensing devices and the at least one infrared radiation sensing device;
a transparent insulating layer on the second surface of the semiconductor layer;
an infrared radiation cut layer on the transparent insulating layer overlying the light sensing devices for filtering out infrared radiation and/or near infrared radiation;
a color filter layer on the infrared radiation cut layer; and
an infrared radiation color filter layer on the transparent insulating layer overlying the at least one infrared radiation sensing device.

12. The semiconductor device of claim 11, further comprising a negatively charged optical layer disposed between the carrier and the transparent insulating layer.

13. The semiconductor device of claim 11, further comprising a grid layer disposed in the transparent insulating layer, wherein the grid layer is located between the light sensing devices and between the at least one infrared radiation sensing device and the light sensing devices.

14. The semiconductor device of claim 11, wherein the infrared radiation cut layer comprises a plurality of first dielectric layers and a plurality of second dielectric layers alternately stacked with each other, and a dielectric constant of the first dielectric layers is different from a dielectric constant of the second dielectric layers.

15. The semiconductor device of claim 12, further comprising another transparent insulating layer, wherein the negatively charged optical layer is disposed between the second surface of the semiconductor layer and the another transparent insulating layer.

16. The semiconductor device of claim 12, wherein the negatively charged optical layer comprises a plurality of kinds of dielectric layers which are alternately stacked with each other, and dielectric constants of the kinds of the dielectric layers are different.

17. The semiconductor device of claim 12, wherein the negatively charged optical layer is formed from hafnium dioxide (HaO2), tantalum pentoxide ($Ta_2O_5$), titanium dioxide ($TiO_2$), or aluminum oxide ($Al_2O_3$).

18. The semiconductor device of claim 13, wherein the grid layer is formed form tungsten (W) or aluminum-copper alloy (AlCu).

19. The semiconductor device of claim 11, wherein a top surface of the color filter layer is substantially level with a top surface of the infrared radiation color filter layer.

20. The semiconductor device of claim 11, wherein a thickness of the infrared radiation cut layer is smaller than 1 micrometer.

* * * * *